(12) United States Patent
Kumar et al.

(10) Patent No.: US 6,628,539 B2
(45) Date of Patent: Sep. 30, 2003

(54) MULTI-ENTRY REGISTER CELL

(75) Inventors: Sudarshan Kumar, Fremont, CA (US); Gaurav G. Mehta, Folsom, CA (US); Sadhana Madhyastha, Los Altos, CA (US); Jiann-Cherng Lan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/872,975

(22) Filed: May 31, 2001

(65) Prior Publication Data

US 2002/0181268 A1 Dec. 5, 2002

(51) Int. Cl.$^7$ ................................................ G11C 19/00
(52) U.S. Cl. .................... 365/78; 365/154; 365/189.12; 365/240; 711/127
(58) Field of Search ........................... 365/154, 189.12, 365/240, 230.06, 78; 711/127

(56) References Cited

U.S. PATENT DOCUMENTS

| | | | | |
|---|---|---|---|---|
| 5,524,226 A | * | 6/1996 | Arioka et al. | 365/230.06 |
| 5,539,279 A | * | 7/1996 | Takeuchi et al. | 365/145 |
| 5,554,874 A | * | 9/1996 | Doluca | 257/390 |
| 5,631,869 A | * | 5/1997 | Ninomiya et al. | 365/230.05 |
| 5,646,878 A | * | 7/1997 | Samra | 365/189.07 |
| 5,726,932 A | * | 3/1998 | Lee et al. | 365/154 |
| 5,813,037 A | | 9/1998 | Martell et al. | |
| 6,049,487 A | * | 4/2000 | Plants et al. | 365/189.04 |
| 6,219,756 B1 | * | 4/2001 | Kasamizugami | 711/127 |
| 6,430,083 B1 | * | 8/2002 | Lu et al. | 365/154 |

* cited by examiner

Primary Examiner—Vu A. Le
Assistant Examiner—Toan Le
(74) Attorney, Agent, or Firm—Cynthia T. Faatz

(57) ABSTRACT

A multi-entry register file cell includes multiple memory elements. A value stored in each of the multiple memory elements may be individually read from the register file cell in response to asserting a single word line.

24 Claims, 4 Drawing Sheets

MULTI-ENTRY REGISTER CELL

BACKGROUND

1. Field

An embodiment of the present invention relates to the field of register files and more particularly, to a multi-entry register file cell.

2. Discussion of Related Art

The increasing power consumption of microprocessors and other integrated circuits (ICs) has become one of the major issues for current and next generation designs. Power-related costs (e.g. cooling and power delivery) can have a significant impact on the overall cost of an integrated circuit chip and, therefore, cut into profit margins in an increasingly competitive marketplace. Additionally, high power consumption and junction temperatures can limit the performance of high-end microprocessors and other ICs.

More particularly, register files and other memory can consume a significant percentage of power on a microprocessor, for example. For current and next generation microprocessors, the size and number of register files and/or memory structures on a microprocessor continues to increase such that the percentage of overall power dissipation attributable to these structures is also expected to rise.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A multi-entry register file cell is described. In the following description, particular types of integrated circuits and circuit configurations are described for purposes of illustration. It will be appreciated, however, that other embodiments are applicable to other types of integrated circuits, and to circuits configured in another manner.

For one embodiment, a register file cell (also referred to herein as a register cell) includes multiple memory elements. A value stored in each of the multiple memory elements may be individually read from the register file cell in response to asserting a single word line. Further details of this and other embodiments are provided below in reference to FIG. 3.

Figure 1:
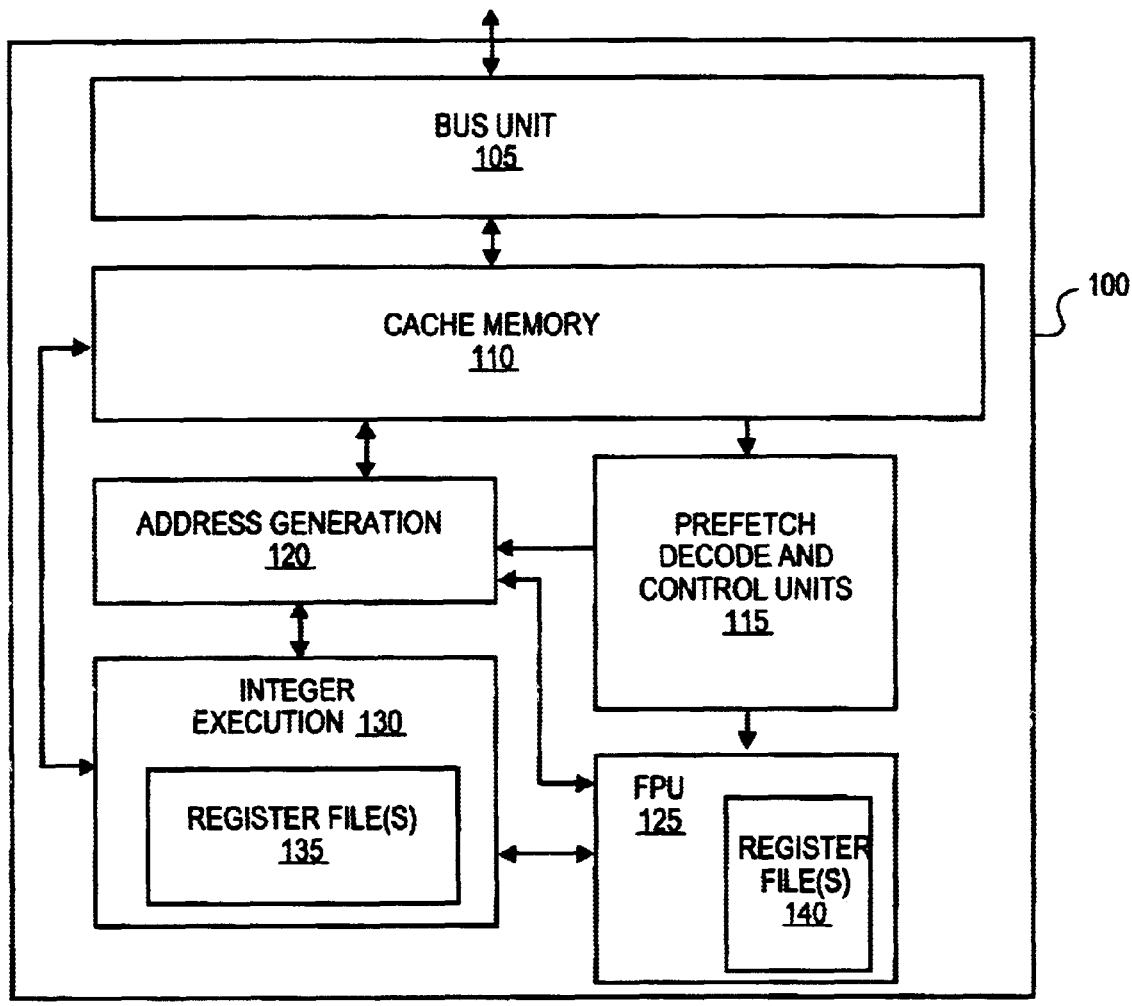
FIG. 1 is a block diagram of a processor in which the multi-entry register file cell of one embodiment may be advantageously used.

FIG. 1 is a block diagram of a processor 100 in which the register file and/or register cells of one embodiment may be advantageously used. The processor 100 is a microprocessor, however, other types of processors and/or other ICs that use register files may also benefit from various embodiments of the multi-entry register cell described in more detail below.

The processor 100 may include, for example, a bus unit 105 to interface with an external bus (not shown), one or more cache memories 110 to store addresses and/or data, prefetch, decode and control units 115, an address generation unit 120, and floating point and integer execution units 125 and 130, respectively.

One or more register files 135 and/or 140 may be included on the processor 100 in, for example, the integer and/or floating point execution units 130 and 125, respectively. A register file is a set of registers that include register cells used to temporarily store data for use in arithmetic and other operations, for example.

It will be appreciated that the processor 100 may include other functional blocks that are not shown in FIG. 1. Further, it will be appreciated that other integrated circuits, including other types of processors configured in a different manner than the processor 100 of FIG. 1, may also include register files and/or individual registers and/or register cells (also referred to herein as register file cells) in accordance with one or more embodiments.

Figure 2:
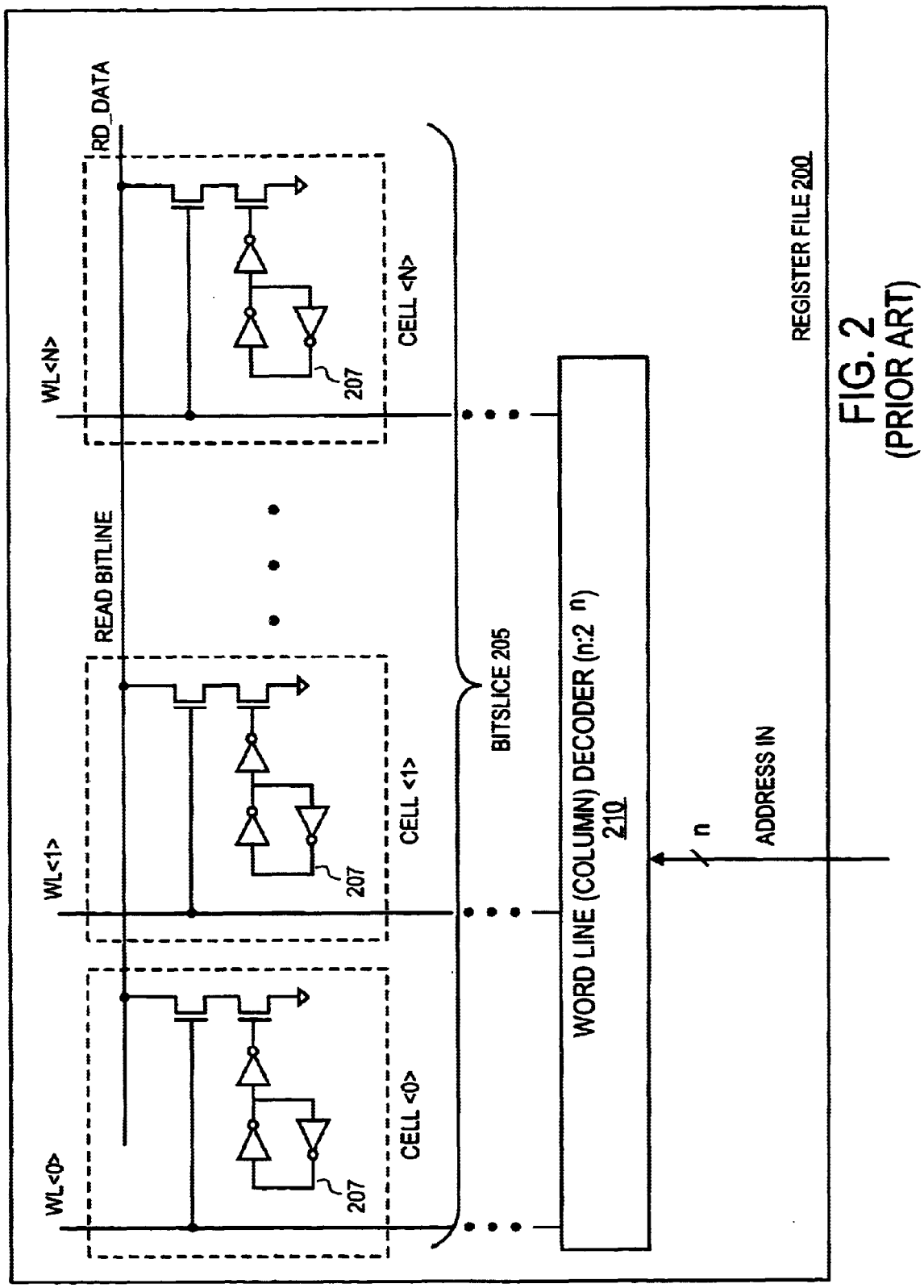
FIG. 2 is a schematic diagram showing the structure of a prior register file bitslice using single entry register file read cells.

FIG. 2 is a schematic diagram of a prior register file 200 that may currently be used to provide one or more register files such as the register files 135 and/or 140. The prior register file 200 includes N register cells per bitslice or bank, i.e. the register file 200 includes N-wide bitslices or N-wide banks. Only one bitslice 205 is shown in FIG. 2 for purposes of illustration, however, it will be appreciated that the register file 200 may include additional bitslices.

Each of the register cells <0> . . . <N−1> in FIG. 2 is capable of storing one bit of data in a corresponding memory element 207. For a register read operation, the data stored in each of the register cells <0> . . . <N−1> is accessible via a corresponding word line wl<0> . . . wl<N−1>. Write control lines and associated circuitry are not shown in FIG. 2, but it will be appreciated that such circuitry may also be included in the register file 200.

To access a particular cell, the corresponding word line is asserted by a word line (or column) decoder 210. For this example, the decoder 210 is an n:$2^n$ decoder where $2^n$ is equal to N. The word line decoder 210 receives an n-bit address over address signal lines 215 and, responsive to the address received, causes one of the word lines wl<0> . . . <N−1> to be asserted. The data value is then read out by discharging the read bit line RD_DATA according to the data value stored in the register cell being read.

For one embodiment, instead of using the register file 200 as described above, the register file 300 of FIG. 3 may be used, for example, to implement one or more of the register files 135 and/or 140 of FIG. 1. For one embodiment, the register file 300 is a dynamic register file.

In contrast to the register file 200 of FIG. 2, the register file 300 is capable of storing two bits of data, or two data values, per register cell. For example, in the bitslice 305 shown in FIG. 3, the register file 300 includes register cells <0> . . . <(N/2)−1>, each of which includes two memory elements and is thus, capable of storing 2 bits of data.

Register cell or register file cell, as the terms are used herein, refer to a basic element of the register circuitry that stores one or more bits of data and that is accessible in response to asserting a single word line. Thus, the register file 300, like the register file 200 is capable of storing N bits of data per bitslice, but the register file 300 is able to do so using only N/2 register cells and N/2 word lines.

For purposes of example, the structure and operation of the cell <0> in the bitslice 305 is described. It will be appreciated that other register cells in the register file 300 are structured and are accessible in a similar manner.

The cell <0> in the bitslice 305 includes two memory elements 310 and 311 that are each individually accessible in response to the assertion of a single word line wl<0>. Where there are multiple bitslices in the register file 300, a row line or bit line (not shown) may also be asserted by a row decoder (not shown) to access a particular bitslice in response to a read address in a manner well known to those of ordinary skill in the art. The particular memory element that is read is then determined according to the state of an address select signal ADDR_SEL on an address select signal line 314 as described in more detail below. For one embodiment, an address select signal line is coupled to each register cell in the register file 300.

In operation, to read a value stored in, for example, the memory element 310 of the cell <0> in bitslice 305, the appropriate n-bit memory read address indicating the memory element 310 is received by the register file 300 over the ADDRESS IN signal lines 315. For one embodiment, the n-1 least significant bits of the address are provided to corresponding inputs of an n-1:$2^{n-1}$ word line decoder 320 while the most significant bit of the address (MSB_ADDR) controls the address select signal line 314.

Figure 3:
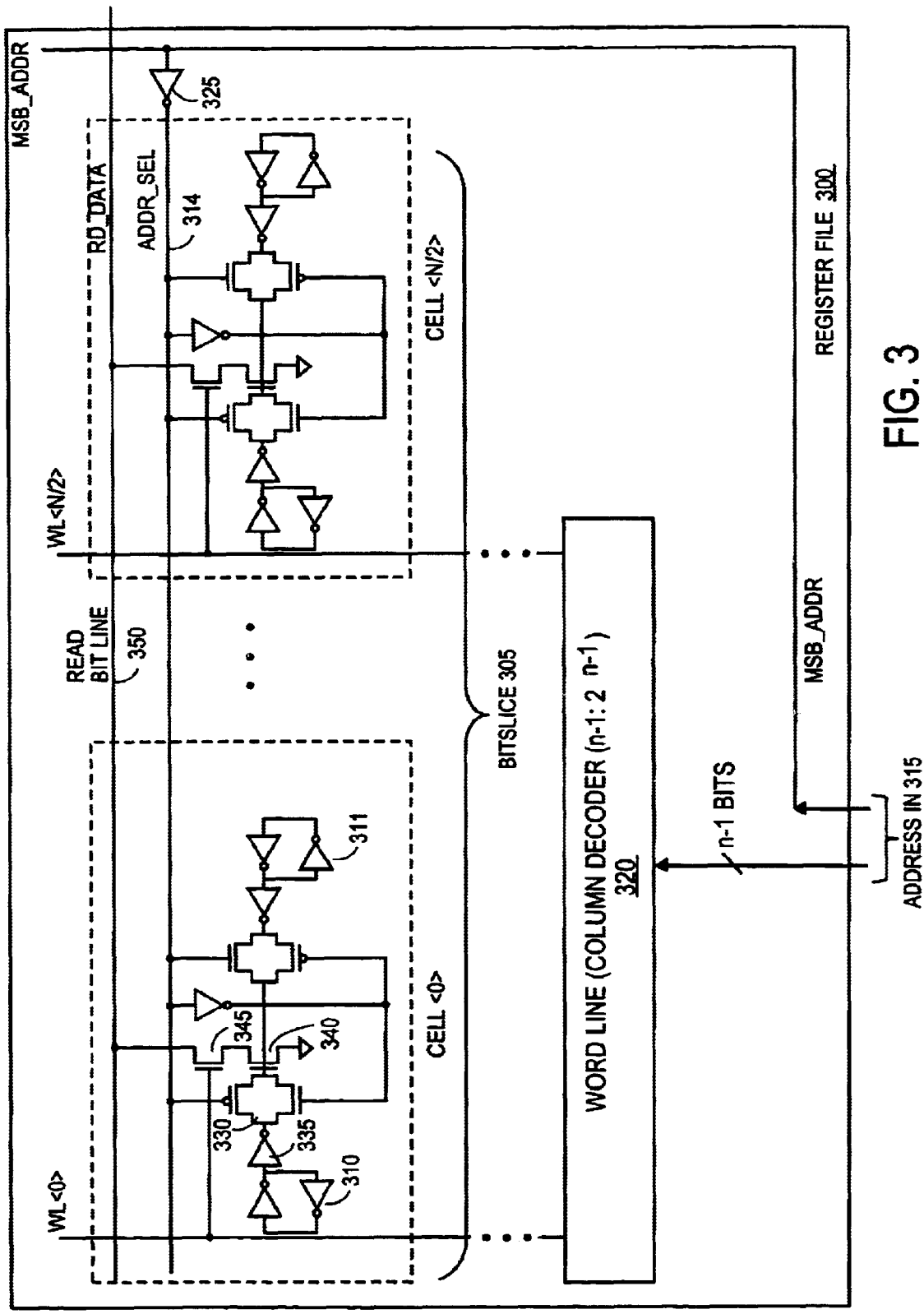
FIG. 3 is a schematic diagram of a register file bitslice structure using a two entry read cell in accordance with one embodiment.

For this particular example, for the embodiment shown in FIG. 3, to select the memory element 310, the most significant bit of the address (MSB_ADDR) is high (i.e. a logic one value). An inverse of the MSB_ADDR signal is provided at an output of an inverter 325 to each of the cells <0> . . . <(N/2)−1> in the bitslice 305 as an ADDR_SEL signal on the address select signal line 314. Where the register file 300 includes other bitslices (not shown), the ADDR_SEL signal is also communicated to each cell in the remaining bitslices of the register file 300. For some embodiments, an inverter corresponding to the inverter 325 is provided for each bitslice in the register file 300.

Thus, where the MSB_ADDR signal is high, the ADDR_SEL signal is low such that a transmission gate 330 is enabled. When the transmission gate 330 is enabled, a data value stored in the memory element 310 is provided through an inverter 335 to a gate of a data transistor 340. It will be appreciated that the low value of the ADDR_SEL signal also causes corresponding transmission gates in other cells of the register file 300 to also be enabled such that data from one memory element of each register cell is available at the gate of a corresponding data transistor.

Concurrently, in response to receiving the n-1 least significant bits of the memory read address indicating the memory element 310, the word line decoder 320 asserts the word line wl<0>. Also, where there are multiple bitslices in the register file 300, a row decoder decodes the memory read address to assert a row select, bitslice select or other such signal to activate the bitslice 305.

For this particular exemplary embodiment, the word lines are active high such that they transition to a logic high level in response to being asserted. When the word line wl<0> transitions high, a cell select transistor 345 is enabled.

For one embodiment the MSB_ADDR signal is a static signal that arrives early enough such that the data value at the data transistor 340 is set up before the cell select transistor 345 is enabled. This timing constraint is facilitated in part by the fact that the most significant bit of the address (MSB_ADDR) does not go through the decoder 315. Thus, when the cell select transistor 345 is enabled, the data value stored in the memory cell 310 is provided on a read bit line 350 as a RD_DATA signal.

For one embodiment, the read bit line is precharged high prior to a register read operation. If the memory element 310 stores a logic high value, the data transistor 340 is not enabled and the read bit line 350 remains at a logic high level. If, however, the memory element 310 stores a logic low value, the data transistor 340 is enabled, and, when the cell select transistor 345 is enabled in response to the word line wl<0> being asserted, the read bit line 350 is pulled down towards a logic low value. In this manner, the memory element 310 is read.

To instead read a data value stored in the memory element 311 of the cell <0>, the most significant bit of the register read address would instead be low. To read memory elements in other cells of the register file 300, the address provided by the n-1 least significant bits is different.

In this manner, the register cells of one embodiment provide for multiple data entries in a single register cell. By providing multiple data entries in a single register cell, the number of word lines is cut in half as compared to a conventional register file storing a similar number of data values. Reducing the number of word lines reduces the required number of word line drivers and thus, reduces word line driver power dissipation. Further, the word line (column) decoder becomes simpler improving the setup time of address lines and reducing decoder power dissipation.

Also, for the embodiment shown in FIG. 3, the number of diffusions hanging on the read bit line 350 is cut in half. In other words, for every two bits of stored data, there is only one transistor (the cell select transistor) directly coupled to the read bit line 314. In this manner, read bit line capacitance is reduced and critical path speed may be improved. Further, the power dissipation related to discharging of the read bit lines may also be reduced.

The multiple entry register file cell of one embodiment includes more devices than a conventional single entry register cell. It may, however, be possible in some cases to reduce the size of a register file using the multi-entry register cells as compared to a conventional register file storing the same amount of data.

For example, for one embodiment, the number of multi-entry register file cells in a row (the X-direction) may be half the number of conventional register file cells in a row where the multi-entry register file cells each store two bits of data. While the two entry register file cell includes more devices, if layout width of a register file cell is limited by the word line wiring, it may be possible to accommodate the extra devices needed for the two entry register file cell without significantly increasing the size as compared to a single entry register cell. For such a case, it is possible to significantly reduce the width of the register file. Reducing the width of the register file results in power and area savings and reduced wiring capacitance of bit lines such that access speed may be improved.

An exemplary embodiment has been described above. For another embodiment, a different number of data values may be stored per register file cell using a different decoding approach. For such an embodiment, the number of word lines used to access the multiple entries per cell is less than the number of entries per cell.

For another embodiment, each of the multi-entry register file cells described above may include more than one read port. For such an embodiment, a read bit line and an address select signal line are provided for each read port.

Also, while the most significant bit of the read address is used to control the ADDR_SEL signal in the embodiment described above, for another embodiment, a different bit of the read address may be used. For the exemplary embodiment above, the most significant address bit is selected to control the ADDR_SEL signal because the address select signal line has a very high fan out. For one embodiment, the address select signal line 314 (FIG. 3) fans out to each bitslice and to N/2 cells within each bitslice. In this manner, it may be important to reduce toggles on this line. Typically, the higher order address bits do not change as frequently as the lower order address bits so it may be helpful to use one of the most significant address bits to control the address select signal line.

Also, for other embodiments, the register file, the memory elements, or the decoders, for example, may be configured in another manner. For example, while all of the register file cells in the register file 300 are capable of storing multiple entries, for another embodiment, only a portion of the register file cells in a given register file may be capable of storing multiple data values.

Figure 4:
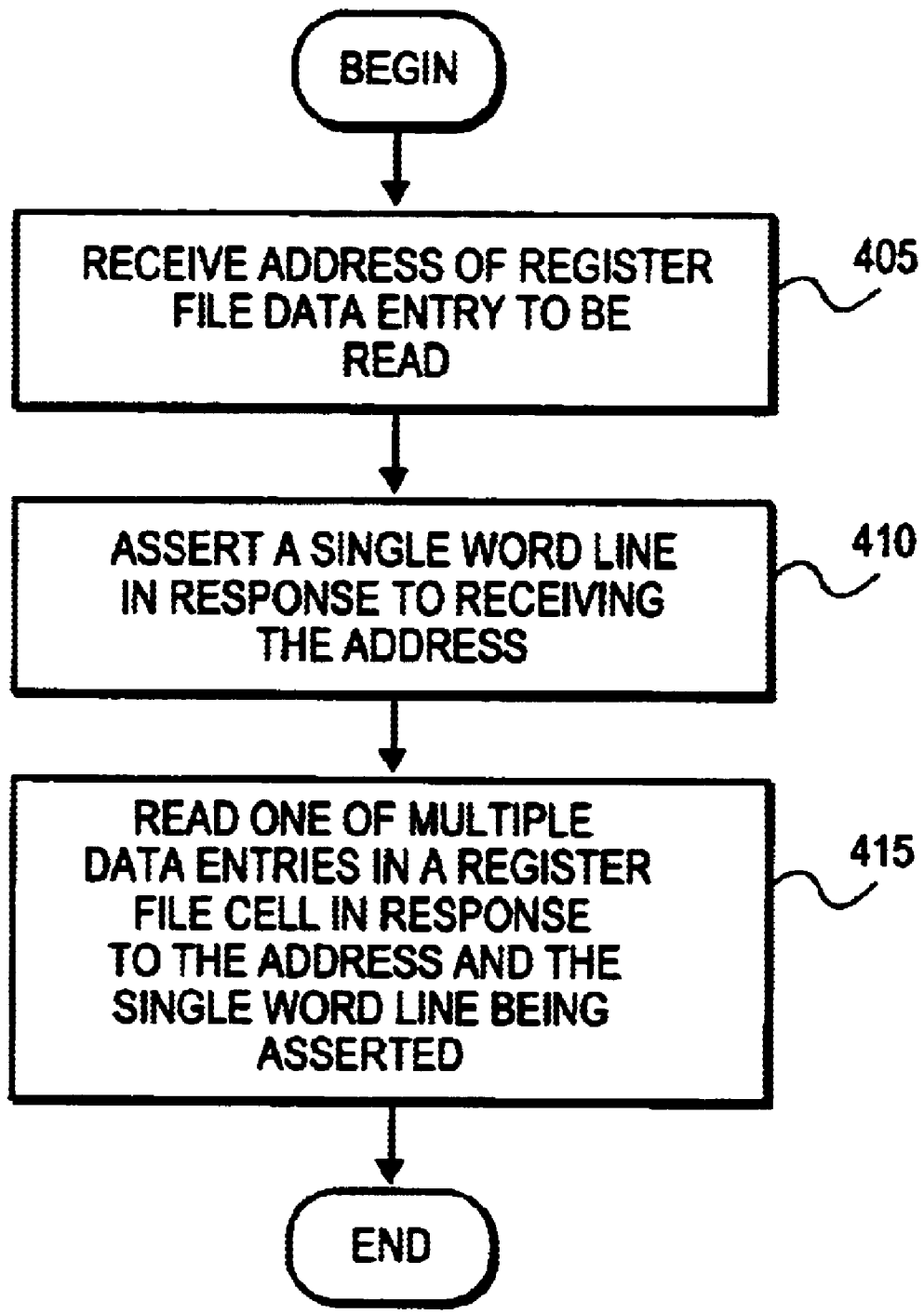
FIG. 4 is a flow diagram showing a method of one embodiment for reading an entry from a register file.

FIG. 4 is a flow diagram showing an exemplary method of one embodiment for reading data from a register file. At block 405, an address of a register file to be read is received and at block 410, a single word line is asserted in response to receiving the address. At block 415, one of multiple data entries in a register file cell is read in response to receiving the address and in response to the single word line being asserted.

For other embodiments, the method may include additional actions not shown or described in reference to FIG. 4.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   in a bitslice, a register file cell including multiple memory elements, wherein a value stored in each of the multiple memory elements is individually readable from the register file cell in response to asserting a single word line; and
   an address select signal line coupled to the register file cell, the address select signal line to communicate an address select signal,
   wherein, data stored in a first one of two memory elements is read in response to asserting the single word line when the address select signal indicates a first logic state, and data in a second one of the two memory elements is read in response to asserting the single word line when the address select signal indicates a second logic state.

2. The apparatus of claim 1 wherein the register file cell includes exactly two memory elements, each of the two memory elements being individually readable in response to asserting the single word line.

3. The apparatus of claim 1 wherein the address select signal is responsive to a portion of a read address indicating the particular memory element to be read.

4. The apparatus of claim 1 wherein the register file cell includes more than one read port.

5. A register file comprising:
   an input to receive a register read address;
   a first number of word lines;
   an array of register file cells arranged in a bitslice, at least one of the register file cells including multiple memory elements such that the at least one register file cell is capable of storing multiple data values, each of the register file cells being coupled to a single one of the first number of word lines, each of the multiple memory elements being read-accessible in response to the register read address and assertion of the word line corresponding to the at least one register file cell; and
   an address select signal line coupled to the at least one register file cell, the address select signal line to communicate an address select signal that is responsive to a portion of the register read address to select one of the multiple memory elements to be read.

6. The register file of claim 5 wherein the address select signal is responsive to the most significant bit of the register read address.

7. The register file of claim 5 further comprising
   a read bit line coupled to each register file cell in a row of the array of register file cells, the read bit line being responsive to a data value stored in the memory element to be read, wherein only a gate per register file cell is directly connected to the read bit line.

8. The register file of claim 5 wherein each of the register file cells in the array of register file cells includes multiple memory elements, the register file further comprising
   an address select signal line coupled to each of the register file cells to communicate an address select signal, the address select signal being responsive to a first portion of the register read address to select one of the multiple memory elements of a register file cell to be read.

9. The register file of claim 8 wherein the address select signal is responsive to the most significant bit of the register read address.

10. The register file of claim 8 further comprising
    a word line decoder coupled to the word lines, the word line decoder to assert one of the word lines in response to receiving a second portion of the register read address.

11. The register file of claim 10 wherein the register read address includes n bits, the address select signal is responsive to the most significant bit of the register read address and the word line decoder receives the n-1 least significant bits of the register read address.

12. A register file comprising:
    an address input to receive a register read address indicating a memory element in the register file to be read;
    a plurality of N-bit bitslices, each of the plurality of N-bit bitslices including fewer than N register file cells, at least one of the register file cells including multiple memory elements; and
    a same number of word lines as register file cells per bitslice, each of the word lines being coupled to a single register file cell per bitslice.

13. The register file of claim 12 further comprising
    an address select signal line coupled to each of the register file cells that includes multiple memory elements, the address select signal line being responsive to a portion of the register read address to select one of the multiple memory elements.

14. The register file of claim 12 wherein each of the plurality of N-bit bitslices includes N/2 register file cells, each of the N/2 register file cells includes two memory elements and the register file includes exactly N/2 word lines.

15. The register file of claim 14 further comprising
    a word line decoder coupled to the word lines and to the address input, the word line decoder to assert one of the word lines in response to receiving a first portion of the register read address.

16. The register file of claim 15 further comprising an address select signal line coupled to the address input and to each register file cell in the register file, the address select signal line to communicate an address select signal that is responsive to a second portion of the register read address to select one of the two memory elements in each of the register file cells.

17. The register file of claim 16 wherein the second portion comprises the most significant bit of the register read address.

18. The register file of claim 16 wherein each of the two memory elements in each of the register file cells is coupled to a transmission gate that is responsive to the address select signal to provide a data value stored in the corresponding memory element to the gate of a data transistor in the register file cell.

19. The register file of claim 18 further comprising a read bit line coupled to each of the bitslices, the read bit line being responsive to a data value being read, and a single cell select transistor per register file cell, the single cell select transistor being coupled to the corresponding read bit line, the cell select transistor being responsive to a corresponding word line to cause the read bit line to be responsive to data at the gate of the data transistor.

20. A method comprising:

providing a first number of word lines for a register file; and providing a register file cell in a bitslice that is capable of storing multiple data entries, wherein each of the multiple data entries is capable of being read in response to the assertion of a single word line; and providing an address select signal line that is responsive to a first portion of a register read address to select one of the multiple data entries to be read.

21. The method of claim further 20 comprising:

providing a word line decoder that is responsive to a second portion of the register read address to selectively assert the single word line.

22. A processor comprising:

an execution unit; and a register file coupled to the execution unit, the register file including an address input to receive a register read address indicating a memory element in the register file to be read;

a plurality of N-bit bitslices, each of the plurality of N-bit bitslices including fewer than N register file cells, at least one of the register file cells including multiple memory elements; and a same number of word lines as the number of register file cells per bitslice, each of the word lines being coupled to a single register file cell per bitslice.

23. The processor of claim 22 wherein each of the plurality of N-bit bitslices includes N/2 register file cells, each of the N/2 register file cells includes two memory elements and the register file includes exactly N/2 word lines.

24. The processor of claim 23 wherein the register file further includes a word line decoder coupled to the word lines and to the address input, the word line decoder to assert one of the word lines in response to receiving a first portion of the register read address; and an address select signal line coupled to the address input and to each register file cell in the register file, the address select signal line to communicate an address select signal that is responsive to a second portion of the register read address to select one of the two memory elements in each of the register file cells.

* * * * *